United States Patent [19]

Negishi et al.

[11] Patent Number: 4,870,690
[45] Date of Patent: Sep. 26, 1989

[54] AUDIO SIGNAL TRANSMISSION SYSTEM

[75] Inventors: Hirokazu Negishi, Epsom Surrey, United Kingdom; Masao Hosaka, Sagamihara, Japan

[73] Assignee: Canon Kabushiki Kaisha, Tokyo, Japan

[21] Appl. No.: 262,177

[22] Filed: Oct. 26, 1988

Related U.S. Application Data

[63] Continuation of Ser. No. 906,274, Sep. 10, 1986, abandoned.

[30] Foreign Application Priority Data

Sep. 10, 1985 [JP]  Japan .................................. 60-199927
Aug. 19, 1986 [JP]  Japan .................................. 61-193448

[51] Int. Cl.$^4$ ............................................. H03G 5/00
[52] U.S. Cl. .................................................. 381/103
[58] Field of Search .................... 381/94, 98, 103, 96, 381/99, 100

[56] References Cited

U.S. PATENT DOCUMENTS

| | | |
|---|---|---|
| 4,306,113 | 12/1981 | Morton . |
| 4,583,245 | 4/1986 | Gelow et al. ....................... 381/100 |
| 4,602,337 | 7/1986 | Cox ...................................... 381/98 |
| 4,633,501 | 12/1986 | Werrbach ........................... 381/100 |
| 4,661,982 | 4/1987 | Kitazato et al. .................... 381/103 |

FOREIGN PATENT DOCUMENTS

| | | |
|---|---|---|
| 0119645 | 9/1984 | Fed. Rep. of Germany . |
| 0094909 | 5/1984 | Japan .................................... 381/98 |
| 0135298 | 6/1986 | Japan .................................... 381/98 |

Primary Examiner—Forester W. Isen
Attorney, Agent, or Firm—Fitzpatrick, Cella, Harper & Scinto

[57] ABSTRACT

An audio signal transmission system includes an input section, an output section and a transmission section interposed therebetween. The transmission section analyzes the spectrum of the input audio signal and performs signal processing based on the result of this analysis and in accordance with the physical response characteristic of the output section.

17 Claims, 9 Drawing Sheets

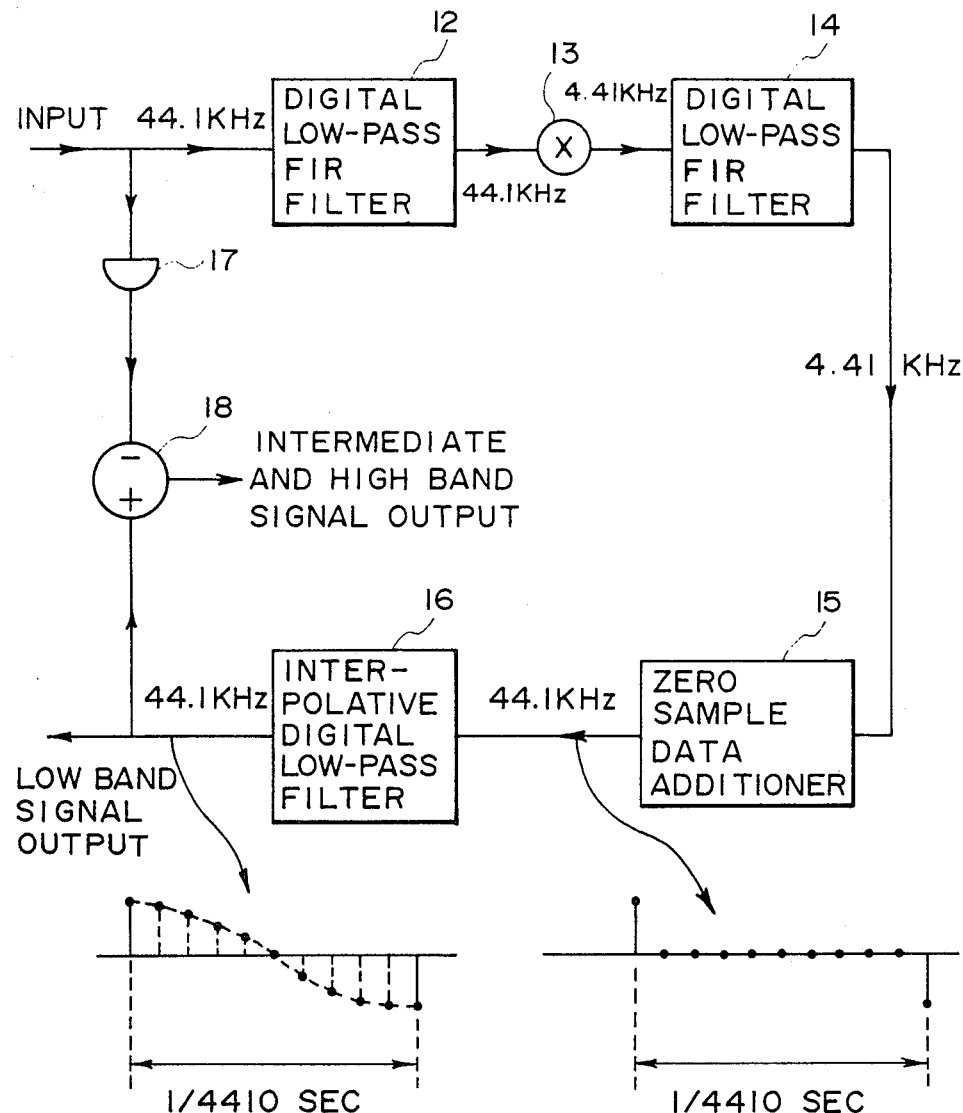
F I G. 3

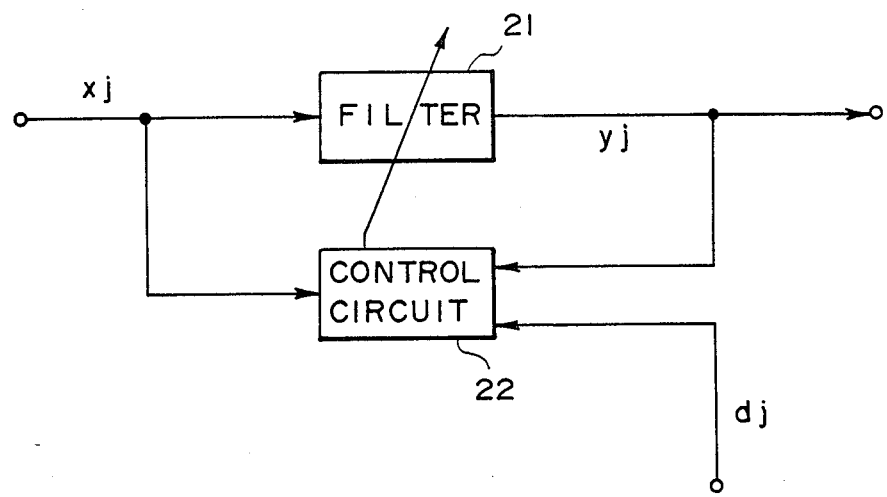
F I G. 5
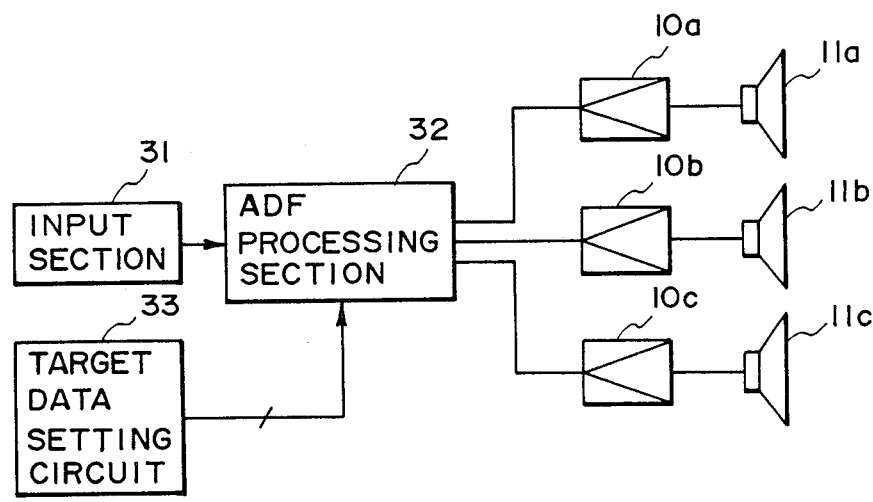
F I G. 6

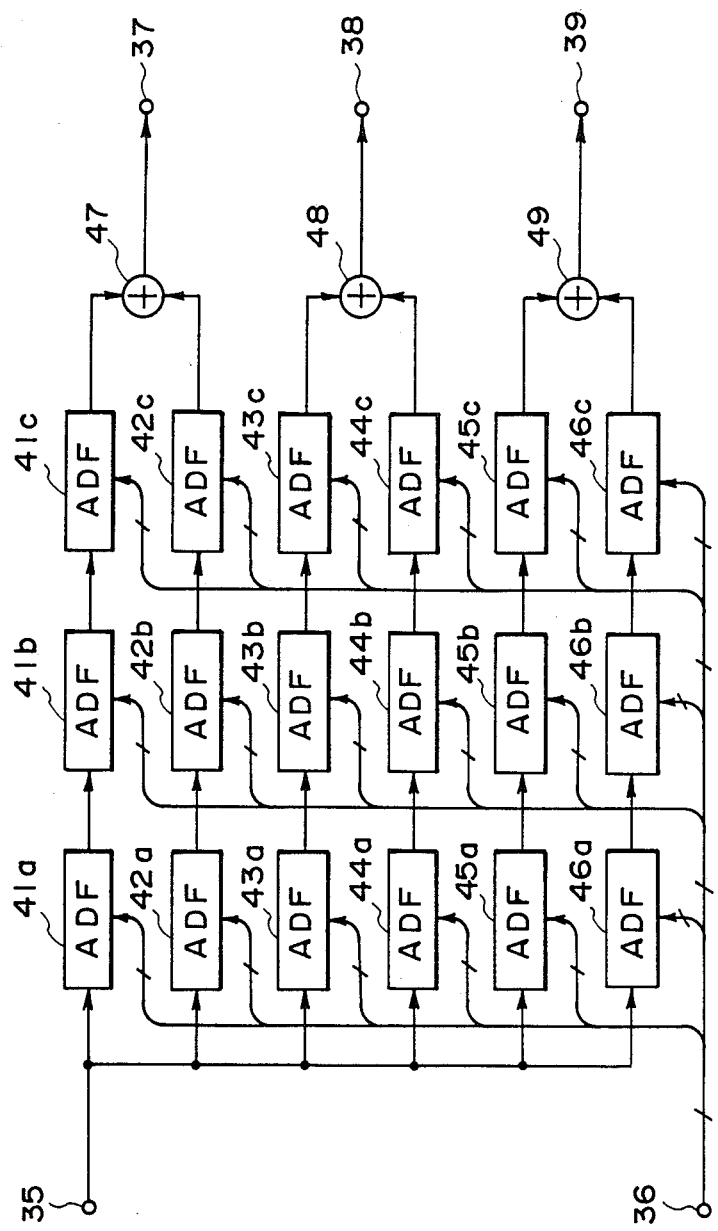
F I G. 7

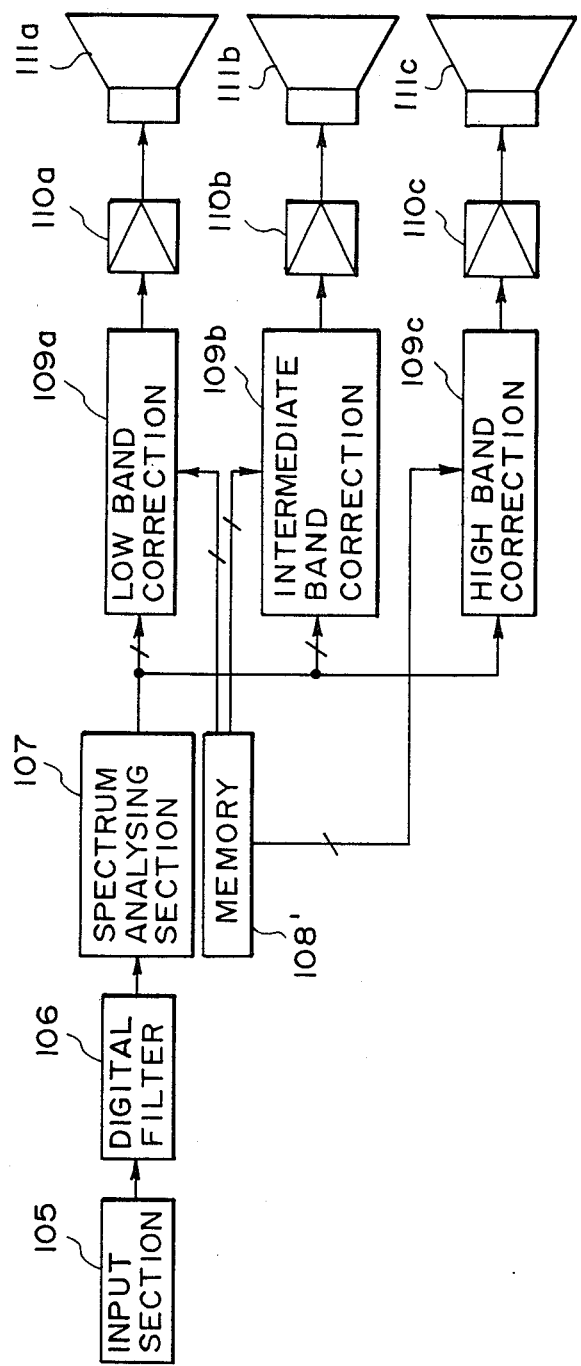
F I G. 12

AUDIO SIGNAL TRANSMISSION SYSTEM

This application is a continuation of application Ser. No. 906,274 filed Sept. 10, 1986, now abandoned.

BACKGROUND OF THE INVENTION

1. Field of the Invention

The present invention relates to an audio signal transmission system for use in digital devices and, particularly to a system which is capable of producing a high-fidelity output.

2. Related Background Art

Recently, in audio systems, various digital devices such as compact disc systems (CD) or digital audio tape recorders (DAT) have appeared thereby to reproduce high-quality audio signals.

Audio techniques for entertainment media have started to spread out in various fields in various manners.

FIG. 1 schematically shows the structure of a general audio device. In FIG. 1, reference character A denotes an input medium, B a transmission section including an amplifier, etc., and C an output section including a loudspeaker, etc. Recent high-quality audio devices are capable of greatly reducing transmission distortion in the transmission section B. This is in large part due to recent remarkably advanced very large scale integration (VLSI) techniques.

Improvements in tone quality using these VLSI techniques follow prevention of tone quantity deterioration due to transmission distortion in the transmission section 2. Enhancements of tone quality which follows an increase in the speed of operation of a large scale integrated (LSI) circuit element which processes digital signals in the CD or DAT, and which follows so-called emphasis processing and/or noise reduction processing is solely intended to suppress transmission distortion in the transmission path and to supply the audio signal input through an input medium A to the output section C with high fidelity using optimized material, structure, etc.

Table 1 shows the fidelity of individual elements of FIG. 1. AS is clear in this table, recently, the fidelity in the input and output sections, especially in the output section, will be greatly deteriorated and there is a large difference between a live voice and a reproduced voice from an audio device, although same may be of high quality.

Mechanical vibration systems such as microphones or loudspeakers, have mass, and the system for holding the vibration system also fulfills the function of a damper. The presence of the mass and damping will result in waveform distortion, and especially, deterioration in the, transient characteristic, and residual vibration. These disadvantages are especially conspicuous in loudspeakers which produce large energy.

For example, the band of audio frequencies is about 20 to 20,000 Hz. It is very difficult to reproduce the entire band of these frequencies with high fidelity using a single loudspeaker. Usually, a plurality of loudspeakers are used to reproduce individual frequency bands thereby to reproduce the entire band of audio frequencies. This process of dividing the input signal into frequency bands and supplying same to a plurality of corresponding loudspeakers, a so-called crossover network division, includes the following two approaches.

One is a passive network which performs division at the output stage of the power amplifier and the other is a multiway system which performs division before the input signal is input to the power amplifier. Generally, the passive network can be composed more inexpensively than the multiway system whereas the multiway system can reproduce the audio signal with more fidelity than the passive network. Generally, the multiway system is employed more often.

The scheme of the multiway crossover network system is either of an analog type which includes a combination of R, L and C elements, or of a digital type which converts the input signal to a digital signal and processes same.

In the analog multiway system, it is difficult to make decay and phase characteristics of the crossover frequency characteristic compatible. The frequency characteristics of the individual systems may not be uniform due t possible uneven characteristics of the corresponding parts included in the respective systems. On the other hand, in the digital type multiway system, the out-of-band decay and phase characteristics are compatible, but the crossover frequency is limited. Especially, a low-band crossover network cannot be realized.

SUMMARY OF THE INVENTION

It is therefore an object of the present invention to provide an audio signal transmission system which is capable of producing a high-fidelity output. po To achieve such an object, according to the present invention, there is provided in one aspect an audio signal transmission system comprising:

(a) an input section;

(b) an output section; and (c) a transmission section for transmitting an audio signal between said input and output sections, said transmission section including:

first means for analyzing the spectrum of the audio signal input by said input section; and second means for processing the audio signal on the basis of the output of said first means and in accordance with the physical characteristics of said output section.

Another object of the present invention is to provide an audio signal transmission system which is capable of realizing the desired frequency characteristic of the crossover network, setting the crossover frequency freely and minimizing distortion due to the crossover network.

To achieve such an object, according to the present invention, there is provided in one aspect an audio signal transmission system comprising:

(a) an input section;

(b) an output section including a plurality of output means having different physical response characteristics;

(c) a transmission section for transmitting an audio signal between said input section and said output section, said transmission section including first means for analyzing the spectrum of the audio signal input by said input section; and second means for dividing the audio signal into a plurality of subaudio signals in accordance with the output of said first means, which subsignals are supplied to the corresponding ones of said output means of said plurality. Other objects and features of the present invention will be apparent from the following detailed description of embodiments thereof when taken in conjunction with the accompanying drawings.

BRIEF DESCRIPTION OF THE DRAWINGS

FIG. 3 shows the specific structure of a spectrum analyzing section and band dividing circuit of FIG. 2;

FIG. 5 illustrates the basic structure of an adaptive digital filter;

FIG. 6 schematically shows the structure of a system as another embodiment of the present invention;

FIG. 7 shows an example of the structure of the adaptive digital filter; processing section of FIG. 5;

FIG. 12 is a schematic block diagram of an example of application of the present invention.

DETAILED DESCRIPTION OF THE PREFERRED EMBODIMENTS

The present invention will now be described using embodiments thereof.

Figure 1:
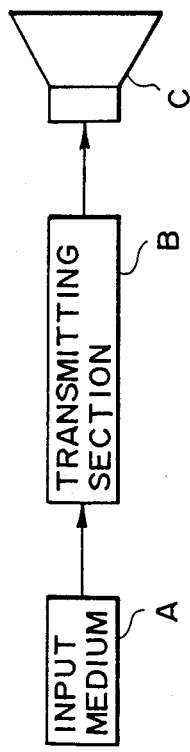
FIG. 1, schematically shows the structure of a general audio device.
Figure 2:
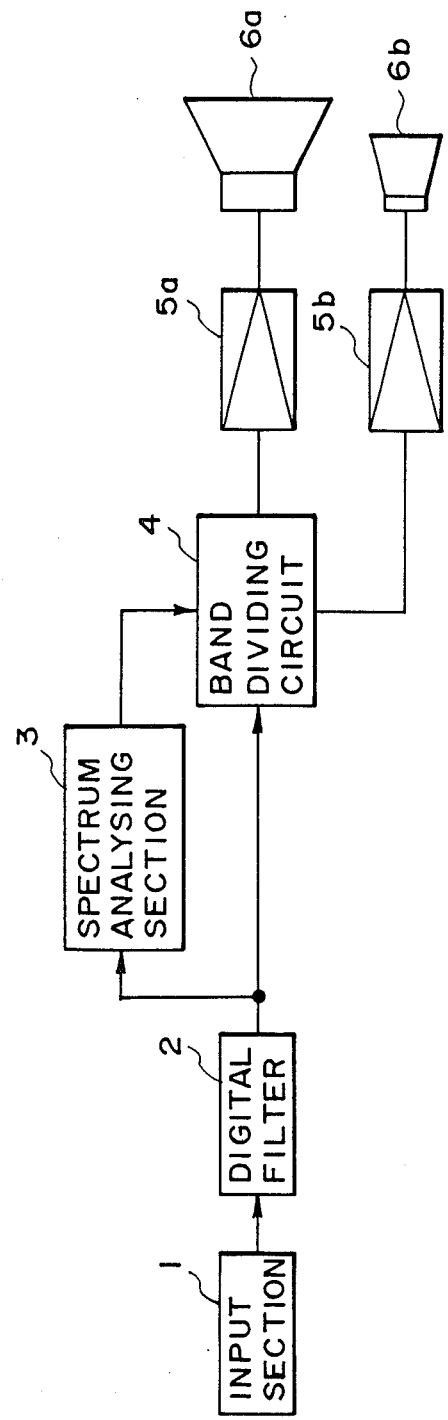
FIG. 2 schematically shows the structure of a system as one embodiment of the present invention.

FIG. 2 shows a schematic structure of a system as one embodiment of the present invention. In FIG. 2, reference numeral 1 denotes an input section which receives an audio signal and outputs it as a digital signal. Reference numeral 2 denotes a digital filter; 3, a spectrum analizer; 4, a band dividing circuit; 5a, 5b, power amplifiers; 6a, a low-pitched tone, or low band, loudspeaker (a woofer); and 6b, an intermediate and high-pitched tone, or intermediate and high band, loudspeaker.

The definite structure of the spectrum analyzing section 3 and band dividing circuit 4 will be now described. FIG. 3 shows an example of such definite structure of the spectrum analyzing section and band dividing circuit which divides an input audio signal into a low band and an intermediate and high band with a border of 200 Hz therebetween.

In FIG. 3, reference numerals 12, 14 denote digital finite impulse-response low-pass filters (hereinafter referred to as FIR low-pass filters). Reference numerals 13, 15, 16, 17 and 18 denote a subsampler, a zero sample data additioner, an interpolative digital low-pass filter, a delay corrector, an intermediate- and high-band signal computing section, respectively.

The operation of the respective elements of FIG. 3 will be described. First, assume that a digital audio signal is supplied to FIR low-pass filter 12.

For simplification of description, a digital audio signal having a sampling frequency of 44.1 kHz output from a conventional compact disc (CD) will be taken as an example of a typical input signal. Signal components of this input signal higher than 2 kHz are filtered out by filter 12. The output of filter 12 is then sampled by subsampler 13 to become a reduced (1/10) sampling frequency (4.41 kHz). The digital audio signal comprising up to 2 kHz signal components and sampled at 4.41 kHz is then supplied to the next stage (FIR low-pass filter 14) which outputs a sampling-frequency (4.41 kHz) signal from which signal components higher than 200 Hz are filtered out.

In order to restore the reduced sampling frequency signal to its original signal, 9 zero sample data are added at zero sample data additioner 15 to the output of filter 14. Thus the sampling frequency returns to its original frequency (44.1 kHz). The interpolative filter 16 converts the 9 zero data to another data which has a sinusoidal wave or the like interpolated between both end elements of the data. That is, a low-band digital output is obtained with frequency components higher than 200 Hz being filtered out.

On the other hand, the intermediate- and high-pitched tone output is calculated from the input and the low-pitched tone output. First, the input is synchronized with the low-pitched tone output at delay corrector 17, i.e., the input is delayed until the low-pitched tone output is obtained. The intermediate-and high-band computing section 18 calculates an intermediate and high-pitched tone digital output from the synchronized input and the low-pitched tone output.

In this way, the use of various digital low-pass filters and change of sampling frequencies allow even digital processing of a low-pitched tone signal, for example, of 200 Hz i.e., having a 5-millisecond period without imposing large load on computation. This system including various digital low-pass filters, subsampler, etc., corresponds to a spectrum analyzing section and signal correcting system which analyzes and selects between a low band and an intermediate- and high-band in a time of the order of a millisecond.

Figure 4:
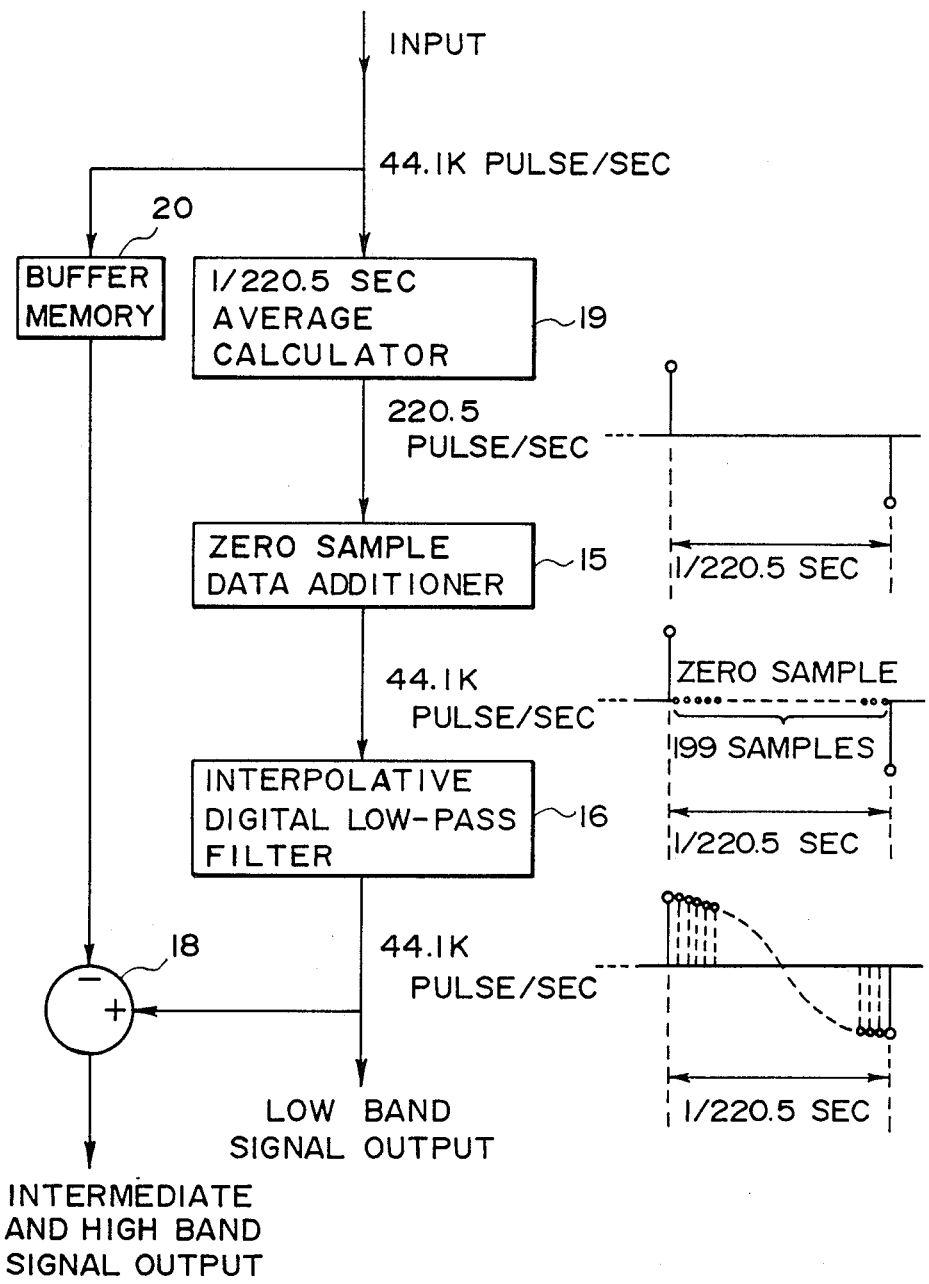
FIG. 4 shows a specific alternative to the structure of FIG. 2.

In FIG. 4, a 113 Hz digital crossover network now will be described which is an alternative to the combination of the spectrum analyzing section and band dividing section of FIG. 2. An average value computing unit 19 calculates, every 1/220.5 seconds, the 200-pulse average value of an input digital audio signal having a 44.1 kHz sampling frequency. On the other hand, the same input data is input to a buffer memory 20. In order to restore the data output from the computing unit 19, every 1/220.5 seconds, to its original 44.1 kHz sampling frequency, 199 zero sample data are added at zero sample data additioner 15 between each data and the next data. Interpolative digital low-pass filter 16 processes the 199 zero sample data so that the space between both the end sample data is interpolated with a sinusoidal curve, thereby resulting in a low-band digital data output with frequency components higher than 113 kHz being filtered out.

On the other hand, the intermediate- and high-pitched pitched tone signal is calculated as the difference between the input data and the low-pitched tone output data, as mentioned above. Buffer memory 20 is neccessary for synchronizing the input data and the low-pitched tone output data. In this respect, the time required for transmitting 200 data at 44.1 k pluses/second corresponds to approximately one half of the wavelength of a signal having 113 Hz, i.e., approximately 4.5 milliseconds. Even if it takes 2.5 milliseconds for computation, it will take a total of 7 milliseconds which is only an approximately 2.4-meter propagation distance for a sonic wave having a speed of 340 meters/second. Even if the intermediate- and high-band signal output calculation mechanism is used in a live loudspeaker, that time lag cannot be detected by human hearing and does not cause a sense of incompatibility.

While the above description has been made on the basis of standards on compact discs, the above system is effectively applicable to other audio signals, for example, the 31.5 kHz signals used in the 8-millimeter video tape recorder (VTR) standards and a 48 kHz digital audio signal used in digital audio tape recorder (DAT). If even an input analog signal is converted to a digital signal at the input stage of the system, the digital signal can be used in the system.

Although, generally, the characteristic of a digital filter does not change, there is known an adaptive digital filter (hereinafter referred to as ADF) which can adaptively change its characteristic by changing its switchable tap positions or the constant of its constant multiplier in accordance with the input digital signal or preset control data.

FIG. 5 shows the basic structure of an ADF. In FIG. 5, reference numeral 21 denotes a digital filter, the characteristic of which can be selected in accordance with control data from a control circuit 22. Reference characters xj, yj, dj denote input signal data, output signal data and target data indicative of a target characteristic, etc., respectively. The control circuit 22 selects a constant of a constant multiplier or a tap position in filter 21 in accordance with data xj, yj and dj. This provides various filters which have various frequency and delay characteristics, etc.

FIG. 6 shows a system using the ADF as another embodiment of the present invention The digital audio signal input at input section 31 and supplied to ADF processing section 32 which in turn supplies an output signal to three power amplifiers 10a, 10b and 10c connected to low, intermediate- and high-pitched tone loudspeakers 11a, 11b and 11c so that these loudspeakers may finally provide ideal outputs. The ADF processing section 32 is composed of a plurality of parallel and series connected ADFs. The reason for this is that the number of delay stages used for performing accurate processing, whether in a FIR filter or in an IIR (infinite inpulse response) filter, is 3 or 4, whereas a sharp frequency characteristic cannot be implemented with a 3 or 4 delay stage digital filter. The sharp frequency characteristic is realized by a series connection of a plurality of ADFs. It is effectively impossible to provide a group of single-system digital filters exhibiting a complicated frequency characteristic, for example, of a multiplicity of peak frequencies when the frequency characteristic is changed variously.

FIG. 7 shows an example of the structure of the ADF processing section 32 of FIG. 6. In FIG. 7, a digital audio signal is supplied via input section 31 to an input terminal 35. Target data is supplied from target data setting circuit 33 to a terminal 36. A plurality of ADFs 41a–46a, 41b–46b and 41c–46c–are connected in a parallel and series manner to form a matrix. Each ADR may have a structure, for example, shown in FIG. 5. Adders 47, 48 and 49 and the outputs of ADFs concerned and supply their output audio signals to terminals 37, 38 and 39 leading to low, intermediate and high band loudspeakers 11a, 11b and 11c, respectively. The target data input at terminal 36 includes data to adjust the characteristic of each ADF individually.

Now, utilization of the above system will be described.

Figure 8:
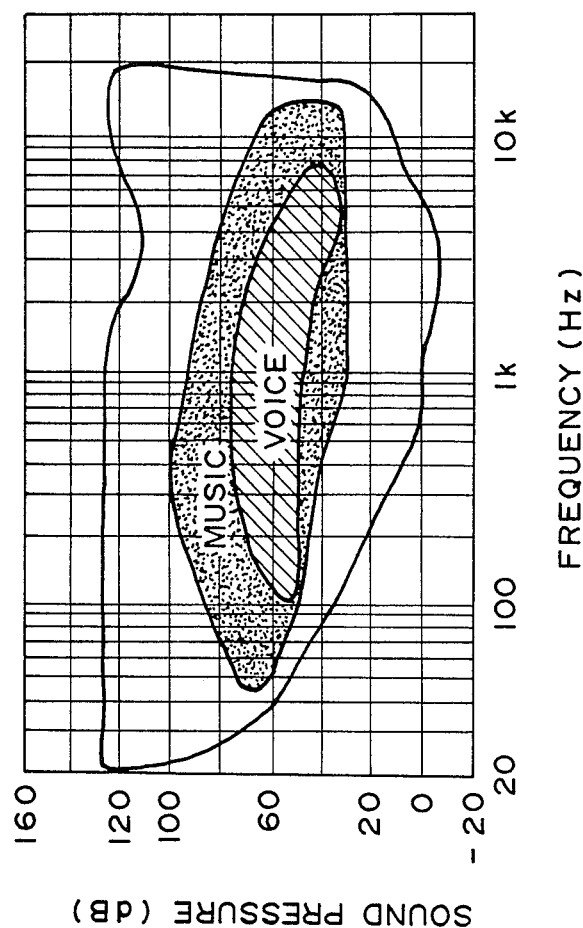
FIG. 8 shows the ranges of frequencies and audio volume contained in music and voice.

One of the basic drawbacks with the multiway system is that a single instrumental sound or a single person's voice will be reproduced by a different loudspeaker depending on the frequencies contained in the sound or voice. Thus, an acoustic image will shift or become obscure. Various measures to avoid these phenomena have been proposed, but are not satisfactory. However, introduction of an ADF would provide a solution. FIG. 8 shows the respective ranges of frequencies and sound volumes contained in music and voice. A professional soloist could utter sound 3 to 6 dB higher than the level of the voice shown, but is it still would be obviously less than the frequency range and volume of a full orchestra. Thus, in FIG. 6, the intermediate band reproduction system, especially loudspeaker 116. should be selected which has as wide a band as possible. Generally, distortion is low as long as the volume is not increased extremely and, for example, a single cone type loudspeaker having a diameter of from 10 to 16 centimeters may be employed.

Now assume that an audio signal including a mixture of a full orchestra portion and a vocal solo-centered portion is input at input section 31 of FIG. 6. The input signal can be classified into two in terms of frequency band (where, for example, 95 percent of the entire signal energy is present) and volume. That is, the full orchestra portion becomes a wide-band, large-volume signal whereas the vocal solo-centered portion becomes a relatively narrow band and limited volume range (see FIG. 8).

Thus, the nature of this input audio signal is determined at the control circuits (see FIG. 7) of the initial-stage ADFs 41a to 41b of ADF processing section 32 thereby to select the respective frequency characteristics. For example, when the solo vocal-centered portion is input, the characteristics of the ADFs 43a–43c, 44a–44c which determine the output signals to the intermediate band loudspeaker are set so that their pass bands are wider than when the orchestra portion is input while the characteristics of the ADFs which determines the output signals to the low and high band loudspeakers are set so that their pass bands are narrower. Such structure permits a vocal solo, the acoustic image for which is made great account of, to be output from the intermediate band loudspeaker alone, thereby avoiding shift and obscurity of the acoustic image. On the other hand, the full orchestra for which wide band, large volume and low distortion factor are made greater account of than the accoustic image is output from the multiway system. In this application, the characteristics of ADFs are controlled in accordance with the input signal.

Now target data will be described. Setting parameters for this target data are considered to include source nature (kind), loudspeaker characteristics, reproduced sound field, user's preference, etc.

There are several genres, such as classic, jazz, pop, rock, vocal for the source nature (kind). Recording/mixing could more or less provide flavoring suitable for the respective genres while all the reproduction systems themselves are not necessarily suitable for those genres. For example, a reproduction system which is capable of emphasizing low and high tones is said to be suitable for pops and rock. Thus target data suitable for each genre is set in a ROM or the like. At playback, the user can select desired target data determined for each genre, using a genre selector, and supply it to the respective ADFs. For loudspeaker characteristics, ADF target data is set on the basis of the frequency characteristic, directivity, damping factor, impedance, etc., of a loudspeaker system to be connected. For reproduction sound field, target data is set on the basis of the setting of a loudspeaker, the acoustic characteristic of a reproduction sound field, the multiprocess in the use of a sound system, etc. The user's preference is related to all of these setting.

Generally, there are the following three concepts for ideal reproduction:

The PHF camp . . . considers it ideal to provide physically high-fidelity reproduction. Generally, the region where an electric signal is processed mainly employs this concept;

The SHF camp . . . makes it ideal to provide reproduction of exactly the same sound as the original one. Transducers such as loudspeakers are not yet completed and are physically incomplete. Thus some compromise and flavoring would be made somewhere. Many of the SHF camp are lovers of classic music.

The GR camp . . . intends to create good comfortable music without sticking to the original sound so much. This concept is strongly supported by lovers of light music.

A further interesting thing is that one's real intention and principle are very different. When many audio lovers are questioned about what a good sound is, they will answer it is this PHF. However, the sound produced by more than 90 percent of loudspeaker systems to be bought is an artificial one. Eventually, one's intention is for either SHF or GR, but one's principle is for PHF. In order to cope with such a user's psychology, it is important to employ a basically PHF-oriented, i.e., transparent structure. For other respects, a target signal value is set as desired. Of cource, there are various preferences among the SHF and GR camps. There are numerous camps such as comfortable-sound lovers, harmonious-sense lovers who make great account of harmony, distinct-tone lovers, large-sound lovers, echoed sound lovers, etc. These preferences are changed to controllable physical amounts which are then supplied as target data to the respective ADFs.

There are some people who desire to reproduce a distinct feature in each concert hall. Of course, target data based on the respective acoustic characteristics of the halls are applied to the respective ADFs. Various application of these ADFs and utilization of ADFs by the aforementioned inputs themselves may be independent of each other or combined. These adjustments, i.e., target data includes data for control of the frequency characteristics, delay characteristics, sound-source position and directivity, etc. The quantity of these target data increases as its systematization proceeds, and the individual target data become complicated individually, thereby requiring a large capacity of memory. Thus, it is advantageous to store control inputs and individual target signal values in a portable memory such as a ROM, a card, a chip, etc. In this case, it is also advantageous to store in the memory data on the explanation for a scene on the place of performance, the target data, etc.

When music information is transmitted to the user by means of various recording media, the characteristics of the sound field, etc., can be transmitted as target data.

In a system using ADFs such as is mentioned above, the spectrum of an input audio signal is analyzed at the respective control circuits of the ADFs. In this case, when the signal is divided in frequency bands, the dividing characteristic may be variable. Control of the ADFs by other parameters may reproduce audio signals of various natures.

Now an embodiment will be described in which a signal is corrected in accordance with the aforementioned characteristics of the loudspeakers.

Figure 10:
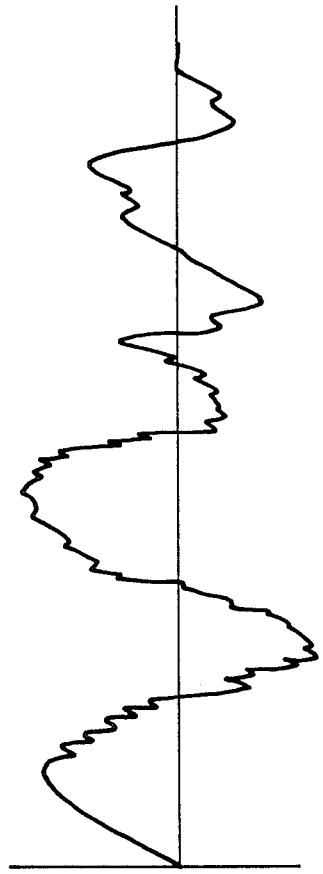
FIG. 10 shows an audio input signal.
Figure 11:
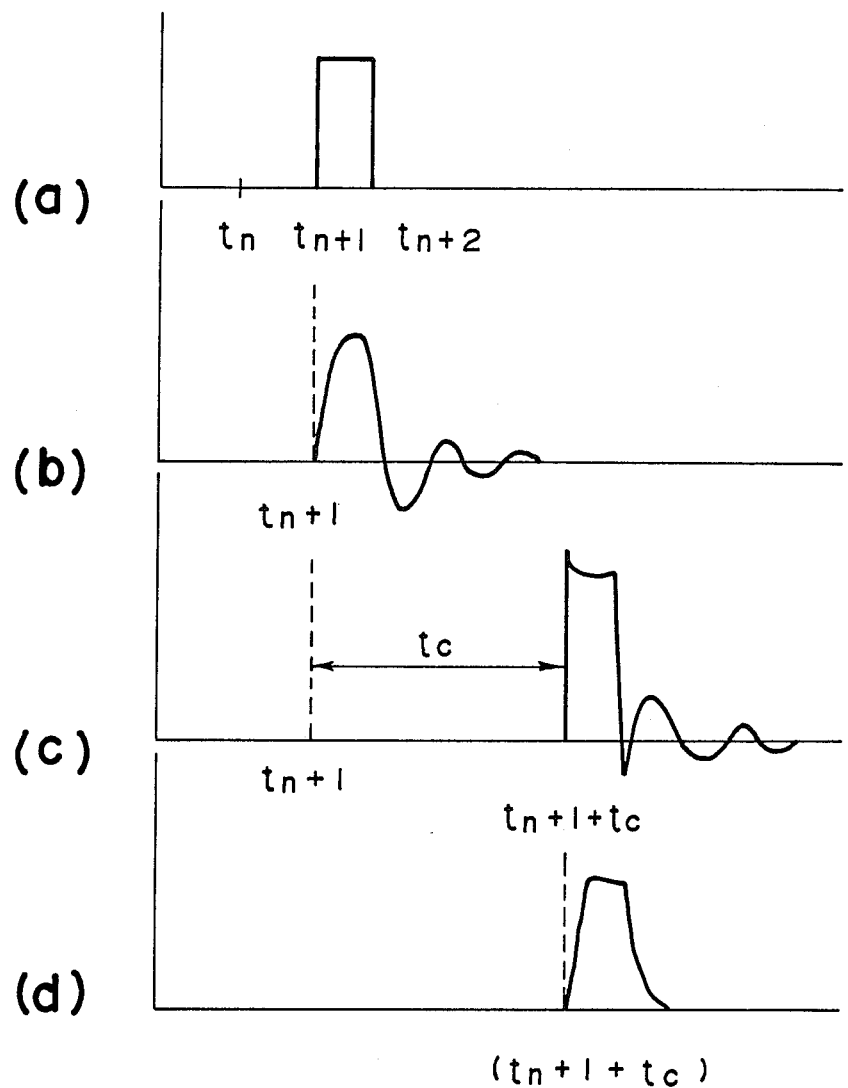
FIG. 11 is a timing chart showing the principle embodiment.

FIG. 10 shows an input audio signal. FIG. 11 is a timing chart for explaining the principle of the present invention. First, the waveform of the input audio signal shown in FIG. 10 is observed and analyzed in spectrum. In this case, the sample frequency should be selected to be twice the maximum audio frequency f m or more, for example, about 40 kHz.

The result of this analysis and data indicative of the input response characteristics of the loudspeakers stored in advance in the memory are used to calculate a corrected signal in a few milliseconds (t c) or so. In FIG. 10, the waveform of the signal (FIG. 11 (a)) actually input at a time t n+1 is supplied to the loudspeakers at t n+1+t c delayed t c from the time t n+1. FIG. 11(b) shows the position of vibration of a loudspeaker obtained when the input waveform of FIG. 11(a) as it stands is supplied to the loudspeaker. A time t n+1−t n denotes a single sample interval.

First, the above calculation involves calculation of the position and acceleration of the loudspeaker vibration system at the time t n+t c using the past input signals in order to fixedly position the loudspeaker vibration system at an ideal position at the time t n+1+t c for the signal input at the time t n+1. An actual corrected input to the corresponding loudspeaker is then calculated using three conditions, i.e., the position and acceleration of the loudspeaker vibration system at the time t n+t c and the ideal position of the loudspeaker vibration system at the time t n+1+t c and data on the physical characteristics including the mass, drive force and damper of the loudspeaker vibration system, stored in the memory.

This corrected input is supplied to the corresponding loudspeaker at the time t n+1+t c, as shown in FIG. 11(c). As a result, the vibration system assumes a position very faithful to the input signal at time delaying t c from the input signal. Thus, the vibration system can vibrate as shown in FIG. 11(d) where the dividing vibrations and deteriorated transient phenomena as shown in FIG. 11(b) are suppressed to the utmost.

Figure 9:
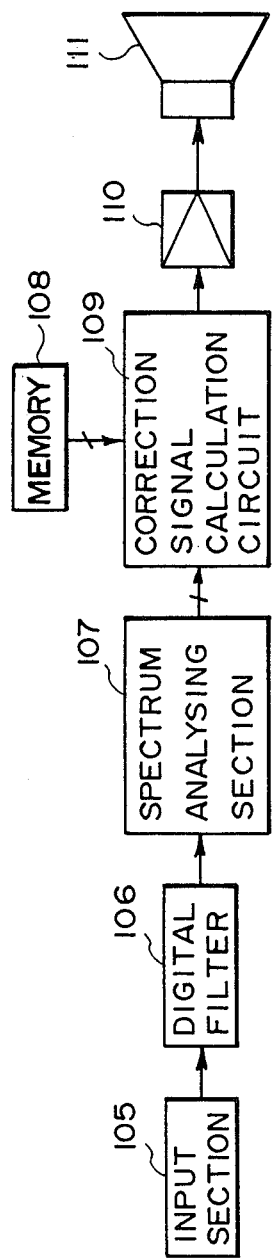
FIG. 9 is a schematic block diagram of the concept of another embodiment of the present invention.

FIG. 9 is a schematic block diagram of the above concept. In FIG. 9, an audio signal is input at input section 105 and supplied to spectrum analyzing section 107 through digital filter 106, thereby providing data such as that mentioned above. Data indicative of the physical characteristics of the loudspeakers 111 stored in the memory 108 and data from the spectrum analyzing section 107 are supplied to the corrected signal calculation circuit 109 which is composed of a special-purpose microprocessor, especially a digital signal microprocessor (DSP), the application of which is recently extensive. Reference numerals 110 denotes an amplifier.

FIG. 12 is a schematic view of a three-loudspeaker system to which the present invention is applied. The above corrected signals for low, intermediate and high bands are calculated at low, intermediate and high band correction circuits 109a, 109b and 109c. The data used for this calculation is supplied from memory 8' in accordance with the physical characteristics of the loudspeakers 111a, 111b and 111c.

If a correction signal calculation circuit such as is mentioned above is constructed using ADFs as mentioned above, for example, it will produce a corrected signal such as is shown in FIG. 11(c).

Generally, the validity of calculating the Fourier spectrum of an audio signal is based on the fact that human hearing is considered to analyze a sound spectrum and identify the sound. Human beings unconsciously attend mainly to the peaks of the Fourier spectrum of an audio signal to talk to each other and recognize others by distinguishing others' voices. In other words, human hearing extracts and processes the spectrum information.

As described above, human beings are capable of performing such complicated processing continuously. On the other hand, when a machine, for example a digital computer, processes sampled information, the calculation time increases greatly as the number of data to be handled increases. However, recently, processors have appeared which are optimal to handling such successive data. The use of this processor would permit the above system to be realized.

What is claimed is:

1. An audio signal transmission system comprising:
   (a) an input section;
   (b) an output section for outputting a sound; and
   (c) a transmission section for transmitting an audio signal between said input and output sections, said transmission section comprising:
   first means for analyzing the spectrum of the audio signal input by said input section to produce variable control signals, said first means being independent of the sound output from said output section; and
   second means for processing the audio signal on the basis of the variable control signals produced by said first means and in accordance with predetermined control signals related to the physical characteristics of said output section, said second means being arranged to improve the transient characteristics of the audio signal to compensate for distortion in the sound outputted by said output section caused by the physical characteristics of said output section.

2. A system according to claim 1, wherein said output section includes a plurality of output means which are different from each other with respect to physical response characteristic and wherein said second means includes means for dividing the audio signal into a plurality of subaudio signals which are supplied to the corresponding output means of said plurality.

3. A system according to claim 1, wherein said transmission section further includes third means for supplying to said second means data on the physical response characteristics of said output section.

4. A system according to claim 3, wherein said third means includes a memory for storing data on the physical response characteristic of said output section.

5. A system according to claim 1, wherein said second means includes an adaptive digital filter having a controllable transmission characteristic.

6. A system according to claim 5, wherein said second means includes series-connected filter means comprising a plurality of series-connected said adaptive digital filters.

7. A system according to claim 6, wherein said second means includes parallel-connected filter means comprising a plurality of parallel-connected said series-connected filter means.

8. An audio signal transmission system Comprising:
   (a) an input section;
   (b) an output section including a plurality of output means having different physical response characteristics; and
   (c) a transmission section for transmitting an audio signal between said input section and said output section, said transmission section comprising:
   analyzing means for analyzing the spectrum of an audio signal input by said input section; and
   a plurality of processing means for respectively producing a plurality of subaudio signals from the audio signal in accordance with the output of said analyzing means, which subaudio signals are supplied to predetermined ones of said output means of said plurality of output means, each of said plurality of processing means being independent of all of the subaudio signals output from said plurality of processing means, and being arranged to improve the transient characteristics of each of the subaudio signals to compensate for distortion in the output of said plurality of output means caused by the physical characteristics of each of said plurality of output means.

9. A system according to claim 8, wherein the audio signal supplied to said analyzing means includes a digital audio signal, and wherein the analyzing means includes means for receiving the digital audio signal and for calculating the average value data of a plurality of successive date of the audio signal.

10. A system according to claim 8, wherein each of said plurality of processing means comprises an adaptive digital filter having a controllable transmission characteristic.

11. A system according to claim 10, wherein each of said plurality of processing means includes a series-connected filter means comprising a plurality of said adaptive digital filters connected in series.

12. A system according to claim 11, wherein each of said plurality of processing means further includes a plurality of said series-connected filter means respectively connected in parallel.

13. A system according to claim 10, wherein each of said plurality of processing means further includes a data generator for supplying data, corresponding to the physical response characteristic of each of said output means, to said adaptive digital filter.

14. An audio signal transmission system comprising:
   (a) an input section;
   (b) an output section for outputting a sound; and
   (c) a transmission section for transmitting an audio signal between said input and output sections, said transmission section comprising:
   first means for analyzing the spectrum of the audio signal input by said input section to produce variable control signals, said first means being independent of the sound output from said output section; and
   second means for processing the audio signal on the basis of the variable control signals produced by said first means and in accordance with predetermined control signals related to the physical characteristics of said output section, said second means including series-connected adaptive digital filters each of which has a controllable transmission characteristic.

15. A system according to claim 14, wherein said second means includes parallel-connected filter means comprising a plurality of said parallel-connected and said series-connected filter means.

16. An audio signal transmission system comprising:
 (a) an input section;
 (b) an output section including a plurality of output means having different physical response characteristics; and
 (c) a transmission section for transmitting an audio signal between said input section and said output section, said transmission section comprising:
 analyzing means for analyzing the spectrum of the audio signal input by said input section; and
 a plurality of processing means for respectively producing a plurality of subaudio signals from the audio signal in accordance with the output of said analyzing means, which subaudio signals are supplied to predetermined ones of said output means of said plurality of output means, each of said plurality of processing means being independent of all of the subaudio signals output from said plurality of processing means, and including series-connected filter means which comprises a plurality of series-connected adaptive digital filters each having a controllable transmission characteristic.

17. A system according to claim 16, wherein each of said plurality of processing means includes series-connected filter means comprising a plurality of said series-connected filter means.

* * * * *

UNITED STATES PATENT AND TRADEMARK OFFICE
CERTIFICATE OF CORRECTION

PATENT NO. : 4,870,690
DATED : September 26, 1989
INVENTOR(S) : HIROKAZU NEGISHI ET AL.   Page 1 of 3

It is certified that error appears in the above-identified patent and that said Letters Patent is hereby corrected as shown below:

AT [56] REFERENCES CITED

Foreign Patent Documents, "0119645 9/1984 Fed. Rep. of Germany" should read --0119645 9/1984 European Patent Office--.

COLUMN 1

Lines 42-43, Insert Table 1 below between lines 42-43.

Table 1

| INPUT SECTION | ELEMENTS | FIDELITY |
|---|---|---|
| TRANSMISSION SECTION | MICROPHONE | ○ |
| | DIGITAL RECORDER | ◎ |
| | ANALOG RECORDER | ○ |
| | CIRCUIT SECTION | ◎ |
| OUTPUT SECTION | LOUDSPEAKERS | △ |

COLUMN 2

Line 15, "make" should read --make the out-of-band--.
Line 30, "output. po To" should read --output. ¶ To--.

UNITED STATES PATENT AND TRADEMARK OFFICE
CERTIFICATE OF CORRECTION

PATENT NO. : 4,870,690
DATED : September 26, 1989
INVENTOR(S) : HIROKAZU NEGISHI ET AL.

It is certified that error appears in the above-identified patent and that said Letters Patent is hereby corrected as shown below:

COLUMN 3

Line 24, "principle em-" should read --principle of the present em---.

COLUMN 5

Line 55, "ADR" should read --ADF--.

COLUMN 7

Lines 21-42, Close up the left margin.

COLUMN 8

Line 20, "at t n+1+t c" should read --at a time t n+1+t c--.
Line 66, "memory 8'" should read --memory 108'--.

UNITED STATES PATENT AND TRADEMARK OFFICE
CERTIFICATE OF CORRECTION

PATENT NO. : 4,870,690

DATED : September 26, 1989

INVENTOR(S) : HIROKAZU NEGISHI ET AL.   Page 3 of 3

It is certified that error appears in the above-identified patent and that said Letters Patent is hereby corrected as shown below:

<u>COLUMN 10</u>

Line 3, "Comprising:" should read --comprising:--.
    Line 32, "successive date" should read
        --successive data--.
    Line 66, "series-connected adaptive" should read
        --series-connected filter means comprising
        a plurality of series-connected adaptive--.

Signed and Sealed this

Fifth Day of February, 1991

*Attest:*

HARRY F. MANBECK, JR.

*Attesting Officer*   *Commissioner of Patents and Trademarks*